(12) United States Patent
Allais et al.

(10) Patent No.: US 7,622,425 B2
(45) Date of Patent: Nov. 24, 2009

(54) METHOD FOR PRODUCING A SUPERCONDUCTIVE ELECTRICAL CONDUCTOR

(75) Inventors: Arnaud Allais, Saint Julien (FR); Dirk Isfort, Bruhl (DE); Claus-Friedrich Theune, Pattensen (DE); Klaus Porcher, Lehrte (DE)

(73) Assignee: Nexans, Paris (FR)

( * ) Notice: Subject to any disclaimer, the term of this patent is extended or adjusted under 35 U.S.C. 154(b) by 154 days.

(21) Appl. No.: 11/977,427

(22) Filed: Oct. 23, 2007

(65) Prior Publication Data

US 2009/0170709 A1    Jul. 2, 2009

(30) Foreign Application Priority Data

Oct. 27, 2006    (EP)    ................... 06291689

(51) Int. Cl.
*H01L 39/04*    (2006.01)
*H01L 39/12*    (2006.01)

(52) U.S. Cl. .............. 505/236; 505/125; 505/232; 505/230; 505/237; 505/238; 174/125.1; 174/15.5

(58) Field of Classification Search .......... 505/236, 505/125, 232, 230, 237, 238; 174/15.5, 125.1
See application file for complete search history.

(56) References Cited

U.S. PATENT DOCUMENTS

| 5,739,086 A | 4/1998 | Goyal et al. ............... 505/473 |
| 6,844,490 B2 * | 1/2005 | Nassi et al. ............... 174/15.5 |
| 6,925,316 B2 * | 8/2005 | Rey ........................... 505/211 |
| 7,325,840 B2 * | 2/2008 | Allais et al. .............. 285/290.3 |
| 2002/0038719 A1 * | 4/2002 | Nassi et al. .............. 174/125.1 |
| 2003/0010527 A1 * | 1/2003 | Metra et al. .............. 174/125.1 |
| 2003/0164246 A1 * | 9/2003 | Nassi et al. .............. 174/125.1 |
| 2004/0255452 A1 * | 12/2004 | Schippl ....................... 29/599 |
| 2006/0240989 A1 * | 10/2006 | Bock et al. .................. 505/100 |
| 2007/0029104 A1 * | 2/2007 | Allais et al. .............. 174/125.1 |
| 2008/0039330 A1 * | 2/2008 | Wolf et al. .................. 505/100 |
| 2008/0083546 A1 * | 4/2008 | Allais et al. ................ 174/15.5 |
| 2008/0119365 A1 * | 5/2008 | Allais et al. ................ 505/400 |
| 2009/0069188 A1 * | 3/2009 | Allais et al. ................ 505/231 |

FOREIGN PATENT DOCUMENTS

JP    2008124014 A * 5/2008

* cited by examiner

*Primary Examiner*—Douglas M C Ginty
(74) *Attorney, Agent, or Firm*—Sofer & Haroun, LLP

(57) ABSTRACT

A method is provided for producing a superconductive electrical conductor, in which a layer of an yttrium-barium-copper oxide (YBCO) is applied as a superconductive material onto a textured metal substrate, and is subjected to a heat treatment. In order to produce a wire-shaped conductor, a textured metal substrate, provided as a strip (2), is initially shaped in its longitudinal direction around an elongate metal support (1) with a circular cross section to form a slotted tube (3) having edges extending in the longitudinal direction and adjoining one another at a slot (4). The slotted tube (3) is next closed by welding the slot (4) shut, and the closed tube (9) is then contracted by pulling until it bears on the support (1). The layer (12) of superconductive YBCO material is thereupon applied all around, and the heat treatment is finally carried out.

4 Claims, 1 Drawing Sheet

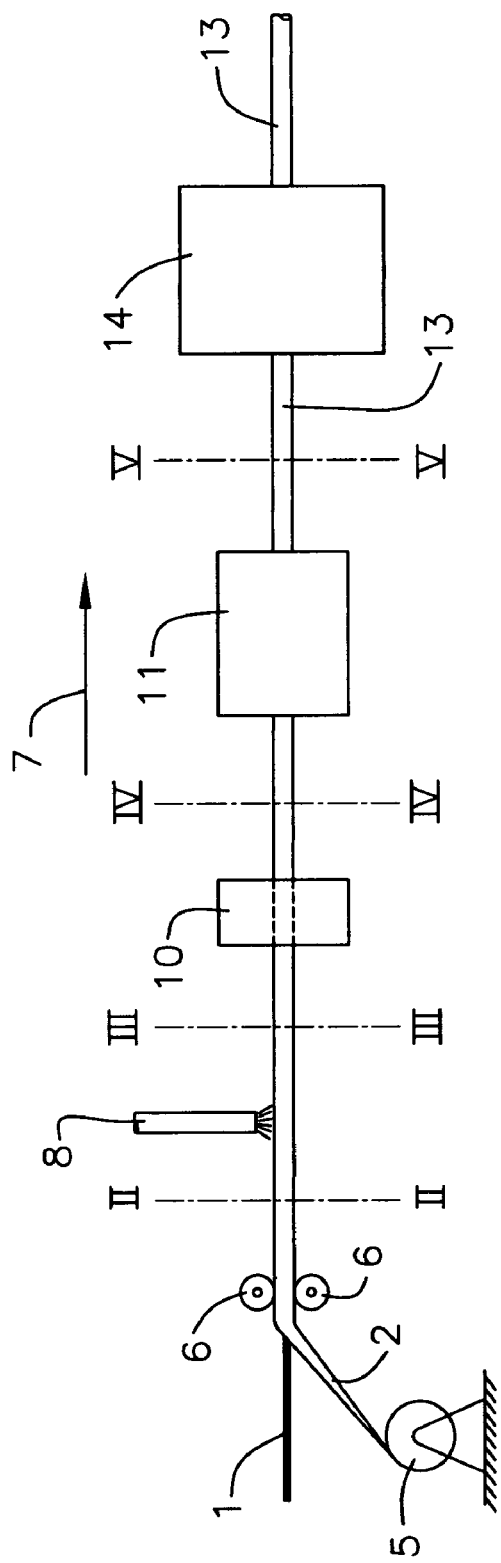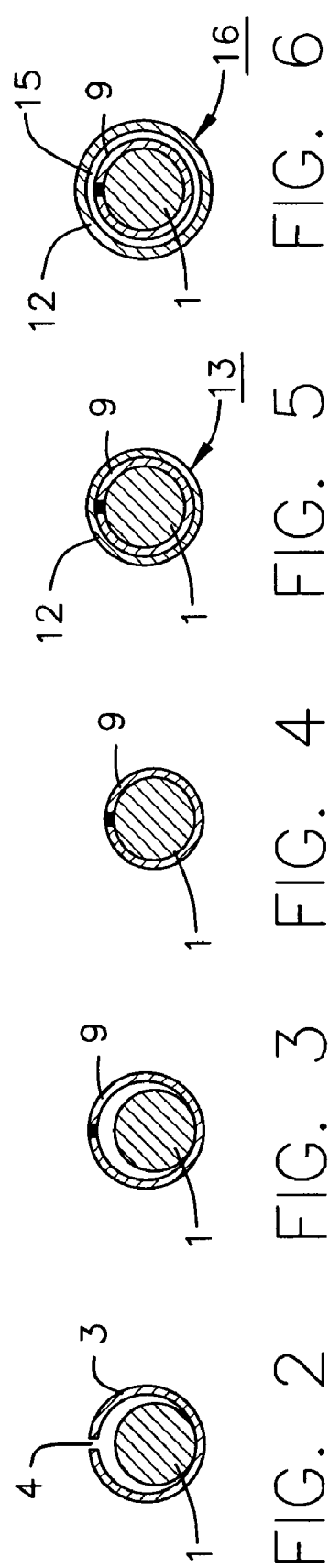

METHOD FOR PRODUCING A SUPERCONDUCTIVE ELECTRICAL CONDUCTOR

RELATED APPLICATION

This application claims the benefit of priority from European Patent Application No. 06291689.5, filed on Oct. 27, 2006, the entirety of which is incorporated herein by reference.

FIELD OF THE INVENTION

1. Description

The invention relates to a method for producing a superconductive electrical conductor, in which a layer of an yttrium-barium-copper oxide (YBCO) is applied as a superconductive material onto a textured metal substrate (U.S. Pat. No. 5,739,086).

2. Background

A superconductive electrical conductor consists of a special material, which enters the superconductive state at sufficiently low temperatures. The electrical resistance of a correspondingly constructed conductor thereby tends towards zero. Suitable materials are for example YBCO (yttrium-barium-copper oxide) or BSCCO (bismuth-strontium-calcium-copper oxide). Sufficiently low temperatures for such a material to achieve the superconductive state lie, for example, between 67 K and 110 K. Corresponding superconductive conductors are referred to as high-temperature superconductors. Suitable refrigerants are for example nitrogen, helium, neon and hydrogen or mixtures of these substances, respectively in the liquid state.

U.S. Pat. No. 5,739,086, which was mentioned in the introduction, describes various methods for producing high-temperature superconductors. In the case of a BSCCO superconductor, for example, a silver tube is filled with the BSCCO material in powder form, and is compacted. The superconductive state is achieved by mechanical deformation of the tube and subsequent heat treatment (annealing). In the case of the YBCO superconductor which is particularly suitable for electrical cables and windings owing to its outstanding electrical properties, a buffer layer likewise consisting of metal is initially applied onto an e.g. biaxially textured strip of metal as a substrate, and then the YBCO material is applied thereon. The substrate consists for example of nickel, copper or iron, or an alloy. Copper or silver, for example, are used for the buffer layer. The YBCO material is subsequently brought into the superconductive state, likewise by heat treatment. The superconductive conductor produced in this way—as already mentioned—may be used advantageously in electrical cables and windings for electrical motors and magnets. Owing to the strip shape, however, it can in this case be bent only in one direction.

OBJECTS AND SUMMARY

It is an object of the invention to refine the method presented in the introduction so as to obtain a more readily processable superconductive conductor based on YBCO.

This object is achieved according to the invention in that a textured metal substrate, provided as a strip, is initially shaped in its longitudinal direction around an elongate metal support with a circular cross section to form a slotted tube having edges extending in the longitudinal direction and adjoining one another at a slot, in that the slotted tube is next closed by welding the slot shut, in that the closed tube is then contracted by pulling until it bears on the support, in that the layer of superconductive YBCO material is thereupon applied all around, and in that the heat treatment is finally carried out.

This method provides an electrical conductor, capable of entering the superconductive state, which can be processed in the same way as conventional wire-shaped conductors. A particular direction for bending the conductor is no longer necessary. It is therefore suitable in particular for the production of windings for electrical motors and magnets, but also for the construction of electrical cables using conventional devices.

BRIEF DESCRIPTION OF THE DRAWINGS

The method according to the invention will be explained as an exemplary embodiment with the aid of the drawings.

FIG. 1 schematically shows an arrangement for carrying out the method according to the invention.

FIGS. 2 to 5 show sectional views of FIG. 1 along the lines II-II and V-V in enlarged representations.

FIG. 6 shows a cross section through a superconductive conductor producible by the method.

DETAILED DESCRIPTION

A metal support, which may be configured as a strand, cord or tube, is denoted by 1. It preferably consists of steel, and it may also fulfil the function of a tension-proof central element for a superconductive conductor to be produced. The support 1 preferably has an outer diameter lying between 0.5 mm and 3.0 mm.

A slotted tube 3, which advantageously lies as close to the support 1 as possible, is shaped around the support 1 using a metal substrate which is provided as a strip 2 and is already textured by pretreatment. Its edges extending in the longitudinal direction bear against one another at an initially still open slot 4. The strip 2 is in this case drawn off from a coil 5 and formed into the slotted tube 3 in a deforming device indicated by rollers 6. It consists for example of nickel, copper or iron or an alloy. For example, a biaxial texture has been imparted to the strip 2 in a pretreatment stage. It preferably has a diameter lying between 50 µm and 150 µm.

The support 1 and the slotted tube 3 are preferably moved continuously in the direction of the arrow 7. In the next working step, the slot 4 of the slotted tube 3 is welded shut in a welding device 8 so as to obtain a tube 9 closed by a weld seam. The welding device 8 may be configured in any way. It is advantageous to carry out welding in an inert gas, according to the tungsten inert gas (TIG) or metal inert gas (MIG) method, or welding with a laser beam. Welding methods with a burnable electrode may also be used. The closed tube 9 then has its diameter reduced in a pulling device 10, until it bears on the support 1. The corresponding element is shown by FIG. 4.

The circularly shaped element produced in this way is subsequently provided all around with a layer 12 of YBCO material, the thickness of which may advantageously lie between 1 µm and 5 µm, in an apparatus 11. This may be done by methods known per se, for example the PVD method (physical vapour deposition) or the CVD method (chemical vapour deposition) or the CSD method (chemical solution deposition). Downstream of the apparatus 11, a finished conductor 13 coated with superconductive YBCO material is then obtained (FIG. 5), which is finally subjected to a heat treatment in a device 14, preferably annealed, in order to achieve the superconductivity. This may advantageously be done at temperatures of from 700° C. to 850° C.

For additional protection of the substrate produced by the strip 2 or the tube 9, a buffer layer 15 closed all around with a thickness of for example 100 nm to 200 nm, which consists for example of ceramic, may also be applied thereon before the YBCO coating. Suitable materials are, for example, cerium oxide or lanthanum-zirconium oxide. The buffer layer 15 may be applied by the same coating methods as mentioned for the YBCO layer 12. The YBCO layer 12 is then applied onto the buffer layer 15 as described, and the heat treatment is carried out in the device 14. A cross section through a correspondingly refined superconductive conductor 16 is represented in FIG. 6.

What is claimed is:

1. A method for producing a superconductive electrical conductor, in which a layer of an yttrium-barium-copper oxide (YBCO) is applied as a superconductive material onto a textured metal substrate, and is subjected to a heat treatment, said method comprising the steps of:

initially shaping a textured metal substrate, provided as a strip, in its longitudinal direction around an elongate metal support with a circular cross section to form a slotted tube having edges extending in the longitudinal direction and adjoining one another at a slot, closing slotted tube by welding the slot shut, contracting the closed tube by pulling until it bears on the support, applying, all around the tube, the layer of superconductive YBCO material; and carrying out the heat treatment.

2. Method according to claim 1, wherein a buffer layer closed all around, made of a metallic material, is applied onto the tube before applying the layer of YBCO material.

3. Superconductive electrical conductor having YBCO material as a superconductive material, produced by the method according to claim 1.

4. Superconductive electrical conductor having YBCO material as a superconductive material, produced by the method according to claim 2.

* * * * *